June 28, 1960 CHAANG HUANG 2,943,269

SEMICONDUCTOR SWITCHING DEVICE

Filed July 8, 1957 2 Sheets-Sheet 1

INVENTOR.
CHAANG HUANG
BY
Elmer J. Nealon
ATTORNEY.

INVENTOR.
CHAANG HUANG
BY
Elmer J. Nealon
ATTORNEY.

United States Patent Office 2,943,269

Patented June 28, 1960

2,943,269

SEMICONDUCTOR SWITCHING DEVICE

Chaang Huang, Watertown, Mass., assignor, by mesne assignments, to Sylvania Electric Products Inc., Wilmington, Del., a corporation of Delaware

Filed July 8, 1957, Ser. No. 670,469

16 Claims. (Cl. 331—111)

This invention relates to electrical translating devices and particularly to semiconductor devices in combination with magnetic fields for controlling the flow of electrical currents.

In controlling electrical currents it is often desired to switch relatively large amounts of electrical energy "on" and "off" by utilizing a small amount of signal to "trigger" the switching or control device. Devices or apparatus which employ such a trigger action generally have two stable states of operation, a cut-off or "off" state during which essentially no current flows through the load and a saturation or "on" state during which maximum current flows through the load. An unstable transition condition exists for a period while switching takes place between these two stable states. The trigger or switching signal need only be sufficient to drive the device or apparatus from its existing stable condition into the unstable transition condition. Once the device attains this condition, the large amount of electrical energy being switched is utilized through positive feedback action to complete the switching to the other stable state.

Since the advent of the transistor many semiconductor devices and circuits have been devised for performing the switching function hereinabove described. Some arrangements utilize the basic two transistor "flip-flop" circuit. Various circuit arrangements and device configurations for single transistor switching have also been developed.

In the well-known two transistor "flip-flop" circuit one transistor is generally turned "on" and the other turned "off" by a single input trigger pulse. Obviously in the "standby" or "off" condition for one of the transistors, considerable power is consumed. The amount of current which can be controlled is also limited by the dissipation limits of the transistors. Some improvement in the basic "flip-flop" circuit utilized for switching purposes can be obtained by appropriate circuit design whereby the transistors are operated in push-pull; i.e., both transistors are turned "on" or "off" together. In this arrangement the dissipation limits of the transistors and the reduced transistor action at high currents determine the maximum current flow.

Bistable switching circuits utilizing a single semiconductor device are also known. In these circuits the characteristics of the device used are such that its characteristic curve includes a negative resistance region intermediate a low current positive resistance region and a high current positive resistance region. The circuit parameters are chosen so that the load line of the circuit intercepts the characteristic curve in the low current region to define a stable "off" condition, in the negative resistance region which is an unstable condition, and in the high current region to define a stable "on" condition. The device is switched from operation in one stable condition to the other stable condition by an input pulse which causes operation of the device to take place in the negative resistance region. Such operation is unstable and the negative resistance characteristic causes positive feedback action to occur until operation in the other stable condition is achieved. The input or trigger power required for such a device must be sufficient to overcome the difference of voltage between that at the stable operating state and that at the junction of the positive and negative resistance region of the charatceristic curve. In other words, the trigger pulse must be sufficient to force the operation into the unstable negative resistance region so that positive feedback can complete the action. Generally there is an appreciable current drain through the device even in the so-called "off" condition. The maximum amount of current which can flow through the device is again determined by the dissipation limit and reduced transistor action of the semiconductor device at high currents.

The power handling capabilities of a transistor utilized for switching purposes may be improved by the use of an avalanche or carrier multiplication junction at the output of the device. However in the fabrication of such a device great accuracy is required in the junction geometry. For example, the width of the base region of the semiconductor must be very narrow in order for satisfactory multiplication of current carriers to occur at the junction.

Therefore, it is a primary object of my invention to provide an improved semiconductor electrical translator for controlling electrical currents.

It is another object of my invention to provide a semiconductor electrical translator capable of switching large amounts of power and having low triggering power requirements.

It is a further object of my invention to provide a semiconductor electrical translator having low power drain in the "off" or standby condition.

It is a still further object of my invention to provide improved semiconductor switching apparatus which is adapted for ease of manufacture in large quantities.

Semiconductor materials such as germanium and silicon which the suitable for use in electrical translating devices may be considered electrically as being intrinsic, as having N-type conductivity, or as having P-type conductivity. These distinctions are well-known as are the methods for obtaining N-type or P-type conductivity by the addition of so-called donor or acceptor materials respectively to the intrinsic semiconductor material. In N-type material the majority current carriers or carriers present in excess are electrons. In P-type material the majority carriers are positive charges or holes.

In a semiconductor device having a region of P-type conductivity and a region of N-type conductivity meeting at a P–N junction, a low impedance to current flow is observed when the N-type region is biased negative with respect to the P-type. When the P-type region is biased negative with respect to the N-type, a high impedance to current flow is observed. The existence of one of these conditions at the junction is known as forward or reverse biasing respectively. When reverse bias is applied to a P–N junction, a space charge region builds up around the junction. If the biasing potential is made large enough, the junction breaks down permitting current to flow with almost no resistance provided by the junction. If the breakdown is due to avalanche phenomenon the breakdown voltage of the junction barrier decreases when an additional number of carriers are introduced into the space charge region. The carriers are accelerated as they enter the high field space charge region and collide with the atoms of the crystal lattice. These collisions produce hole-electron pairs and each carrier of each pair collides with another atom thus producing further hole-electron pairs. This multiplication process releases a great number of carriers in a short time effectively breaking down completely the high resistance of the junction.

The effects of magnetic fields on electrical currents flowing through semiconductors is known. When a magnetic field is applied to semiconductors, the current carriers will be deflected from their normal path. The current carriers may be either electrons or holes in a semiconductor. When each of the types is flowing in a direction opposite to that of the other a magnetic field tends to deflect the holes and the electrons to the same side, and the carriers then neutralize each other resulting in no change in direction of current flow. However, if the current is made up predominantly of only one type of carrier, the current will be deflected by the magnetic field.

In its broadest aspect my invention comprises a body of semiconductor material having a bulk region of one conductivity type which forms a junction with a portion of the body of the opposite conductivity type. Means are provided for injecting bulk minority carriers into the bulk region and means are also provided for extracting bulk minority carriers from the bulk region. The bulk minority carriers so injected are directed either toward the extracting means or toward the junction by the action of a magnetic field.

It is a feature of my invention to provide a reverse biased avalanche or carrier multiplication junction between the bulk of the body and the portion of opposite conductivity. While the potential gradient across the junction is less than the breakdown voltage, essentially no current flows. The introduction of bulk minority carriers from the bulk into the junction region causes breakdown of the junction permitting practically unlimited current flow therethrough.

It is another feature of my invention to provide means for varying the magnetic field strength, which means operates in association with the current flow through the junction so as to augment the breakdown action once it has begun.

It is a still further feature of my invention to bring about triggering of the apparatus from the "off" condition of no current flow to the "on" condition of high current flow by introducing bulk minority carriers from the injecting means into the space charge region of the reverse biased junction, thereby causing breakdown of the junction.

My invention may be more fully understood from the following detailed description of the accompanying drawings, in which.

Figure 1:
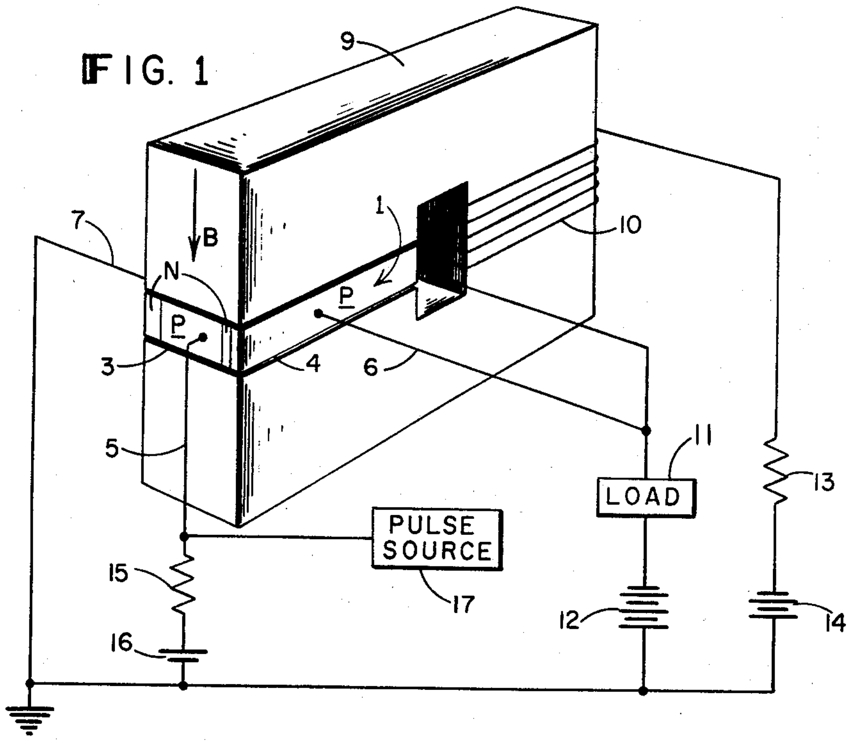
Fig. 1 is a schematic diagram of a preferred embodiment of my invention utilized as a switch for controlling flow of electrical current through a load impedance.
Figure 1A:
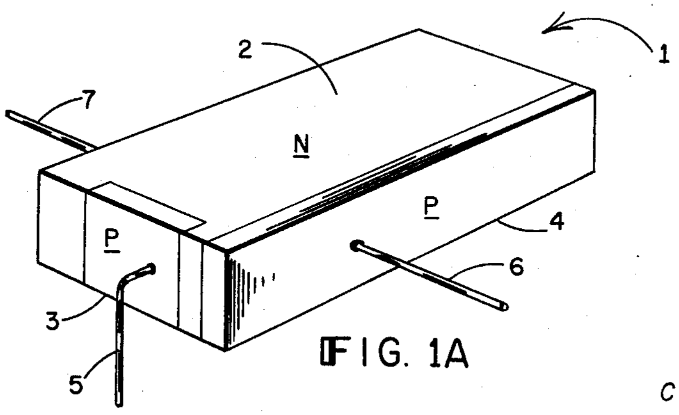
Fig. 1A shows the configuration of the semiconductor element forming part of the apparatus of Fig. 1.

Figs. 1 and 1A show a body of semiconductor 1, the bulk 2 of which is of N-type conductivity. Two portions 3 and 4 of the body are converted to P-type conductivity as by employing known diffusion techniques. Leads 5 and 6 make ohmic contact with the P-type portions 3 and 4 respectively at what may be termed the source and collector terminals. A third lead 7 makes ohmic contact with the bulk of the semiconductor body at what may be termed the drain terminal. The region of the bulk adjacent the drain terminal desirably is made more heavily N-type than the remainder of the bulk to insure a good ohmic contact.

More specifically the semiconductor body as I have shown it consists of a block of phosphorous doped monatomic crystalline silicon of from 2 to 3 ohm-cm. resistivity. The dimensions of the block are .100 by .400 by .050 inch. The block is prepared by slicing, grinding, and etching from a single crystal ingot which may be prepared by employing any of the well known techniques. The P-type regions are formed by diffusing an acceptor impurity, such as, for example, boron, for a predetermined desired depth into the block. In the device shown a layer of .002 inch is converted to P-type conductivity. The surfaces may be prepared for the diffusion of material by masking the areas not to be converted. In the specific embodiment shown the P-type region 4 constituting the collector of the device covers the total area of one .050 by .400 inch face of the block. The P-type region 3 constituting the source is located in a 0.50 by .100 inch face adjacent the collector. In order to prevent shorting of the source and collector the area of the source is .050 inch by about .090 inch and a region of the N-type bulk of the device of about .004 inch thickness separates the source and collector, as shown. The drain is located in the .050 by .400 inch face opposite the collector and adjacent the source, the drain terminal being obscured from view in Figs. 1 and 1A.

The silicon body with attached electrodes shown in Fig. 1A is placed within the gap of an electromagnet 9 as shown in Fig. 1. The spacing between the surfaces of the semiconductor and the magnet pole faces are made relatively small. Desirably this spacing should be a minimum consistent with absence of contact at any point with the magnet pole faces. All of the semiconductor body involved in the operatoin of the device lies within the field of the magnet. The magnet is energized by means of field winding 10. One terminal of the field winding is connected directly to the collector lead 6 and also through the load impedance 11 to the negative terminal of a D.C. potential source 12. The other terminal of the field coil winding is connected through a current limiting resistor 13 to the negative terminal of a second D.C. potential source 14 of lower voltage than the first potential source. The positive terminal of each potential source or battery is connected to ground and to the drain lead 7. The source lead 5 is connected through a current limiting resistor 15 to the positive terminal of a D.C. potential source 16, the negative terminal of which is grounded. A source of trigger pulses 17 is connected directly to the source lead 5.

In order to provide for desired operation of the device described having a collector breakdown voltage of from 65 to 70 volts, battery 12 has a potential of 60 volts and battery 14 a potential of 30 volts. The magnetic field winding current limiting resistor 13 is chosen so as to achieve the desired magnetic flux through the silicon body. A field strength of 10 kilogauss is employed in the device described. With the voltage drop of 30 volts in the field circuit, a coil of sufficient number of turns, and a suitable magnetic material for the magnet, a field current of the order of 3.5 milliamps is sufficient. In any event, the proper current may be obtained by selection of the value of resistance for resistor 13. P-type regoin 3 is biased positive by a battery 16 of one volt. A source of holes is thus provided for injection into the bulk region of the silicon. Resistor 15 of the order of 10 kilohms is provided to limit the quantity of holes flowing through the source-drain circuit during the stable "off" condition of the apparatus to a current of the order of 100 microamps. Limitation of the current is necessary since the potential drop through the silicon body from the source terminal to the drain terminal is only about .5 volt with a current flow of 5 amps.

The operation of the specific embodiment of my invention as described hereinbefore may be understood in terms of various semiconductor phenomena previously discussed. In the "off" condition with substantially no current flow through the load 11, the collector terminal is at a potential of approximately 60 volts negative. This condition establishes a reverse bias on the collector junction which is just below the breakdown voltage of 65 to 70 volts. During the existence of this condition a small reverse current of the order of one milliampere flows.

The 60 volt negative potential is also applied to one of the terminals of the field winding thus establishing a net potential drop of approximately 30 volts in the field coil circuit. The resultant small field current flow of the order of 3.5 milliamperes establishes a magnetic field of 10 kilogauss strength in the direction of the arrow B of Fig. 1. The positive potential applied to the source causes holes to be injected from the P-type region 3 into the bulk of the silicon body; the quantity of holes being regulated by the current limiting resistor 15. The magnetic field causes these holes to be deflected to the drain terminal. Thus, in the "off" condition a small current of holes flows from the source to the drain due to the influence of the magnetic field, and the collector junction is reverse biased slightly below the breakdown potential. This condition is stable and will continue to exist until an outside influence upsets the equilibrium of the circuit.

The action of switching the apparatus "on" so that current flows through the load is initiated by introducing a quantity of holes into the space charge region of the reverse biased collector junction. The pulse source 17 is actuated to provide a positive pulse at the source terminal. This action causes a large current pulse to flow through the source junction resulting in a high hole density near the junction. Some of the holes flow by dicusion to the space charge region of the collector junction. As explained previously this causes avalanche breakdown of the junction to occur with resultant high current flow through the collector. A trigger pulse of the order of 2.5 watts is sufficient to initiate the switching action.

As the current flows through the collector and the load 11, the potential at the collector terminal approaches ground. The battery 14 thus establishes a net potential of about 30 volts across the field winding circuit of such polarity as to reverse the field current. The consequent reversal of the magnetic field causes holes injected at the source to be deflected to the collector rather than to the drain. The effects of increasing the collector current and reversing the magnetic field are thus mutually cumulative and once started proceed until the stable "on" condition exists regardless of the withdrawal or cessation of the positive pulse. In the "on" condition the current flow is largely in the drain-collector circuit and partly in the source-collector circuit. Almost all of the potential drop takes place across the load since with the injection of a large amount of carriers the voltage necessary to sustain avalanche breakdown is very low. If the resistance of the load is, for example, 3 ohms, a current of about 20 amperes flows providing output power of 1200 watts. Power dissipation at the collector junction is then of the order of 20 watts.

The apparatus remains in the stable "on" condition until an effect is introduced to upset the equilibrium of the circuit. The pulse source 17 can be utilized to perform this function. When a negative pulse is applied to the source terminal, the flow of holes to the collector junction is interrupted thus disrupting current flow through the collector and causing the potential at the collector terminal to become more negative. The resultant change in the magnetic field tends to permit holes to flow to the drain rather than to the collector, thus further tending to change the magnetic field. The triggering "off" action is thus cumulative, resulting finally in the complete reversal of the magnetic field, the positive deflection of holes to the drain, and the reestablishment of a reverse bias at the collector junction.

Figure 2:
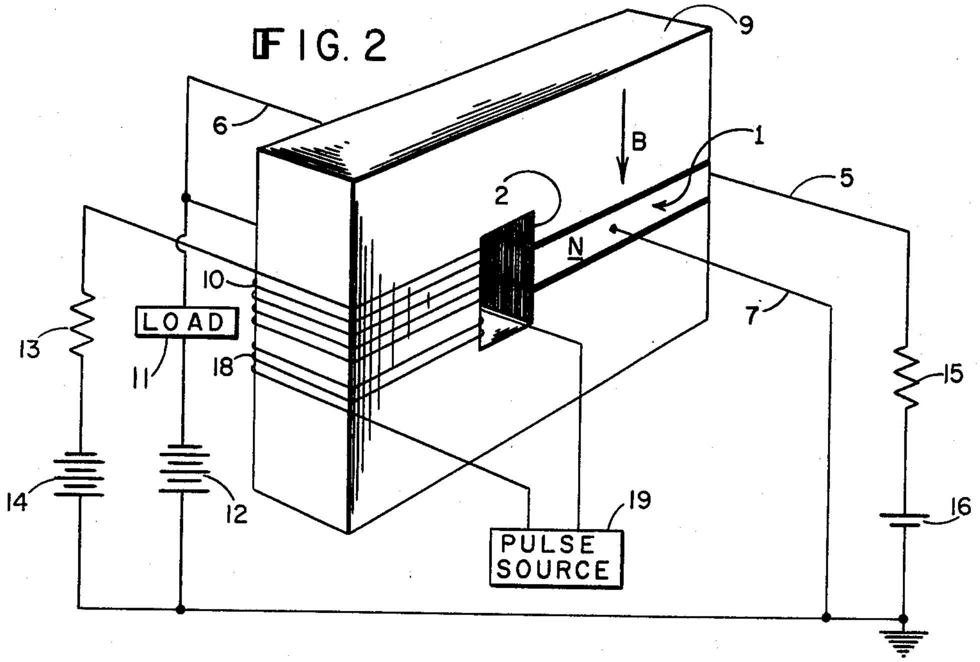
Fig. 2 is a schematic diagram of another preferred embodiment of my invention similar to the apparatus of Fig. 1 but employing a different triggering means.

Another embodiment of my invention is shown in Fig. 2. The apparatus is the same as that shown in Fig. 1, except that the trigger signal source 17 of Fig. 1 has been eliminated and in its place a magnetic field trigger winding 18 together with a pulse source 19 is provided for influencing the magnetic field. When the current is "off," the same stable condition exists as in the circuit of Fig. 1. As in that apparatus, the action of switching "on" is initiated by introducing a quantity of holes into the space charge region of the reverse biased collector junction. In this embodiment, however, the holes which are flowing from the source to the drain are deflected and caused to flow toward the collector by reversing the magnetic field. A pulse of proper polarity and magnitude to reduce the existing magnetic field and thereby permit diffusion of holes to the collector junction region or to completely reverse the magnetic field and more positively deflect the holes is supplied by the pulse source 19. The introduction of holes into the space charge region of the reverse biased collector junction causes avalanche breakdown of the junction with resultant high current flow. The pulse power required to reverse completely the magnetic field is slightly over one watt. The resulting actions throughout the circuit once the collector current starts to flow are exactly the same as in the circuit of Fig. 1. The cumulative effect of the collector current flow and the magnetic field reversal proceed until the stable "on" condition is achieved.

In order to turn the circuit "off," a pulse opposite to that required to turn the circuit "on" is supplied to the magnetic field trigger winding by the trigger pulse source. As the resultant reversal of the magnetic field disrupts the flow of holes from the source to the collector, the multiplication of carriers at the collector junction is disrupted and the potential at the collector changes, thus further tending to change the magnetic field. The triggering "off" action is thus cumulative; resulting in the complete reversal of the magnetic field, the deflection of holes to the drain, and the reestablishment of reverse bias at the collector junction.

Figure 3:
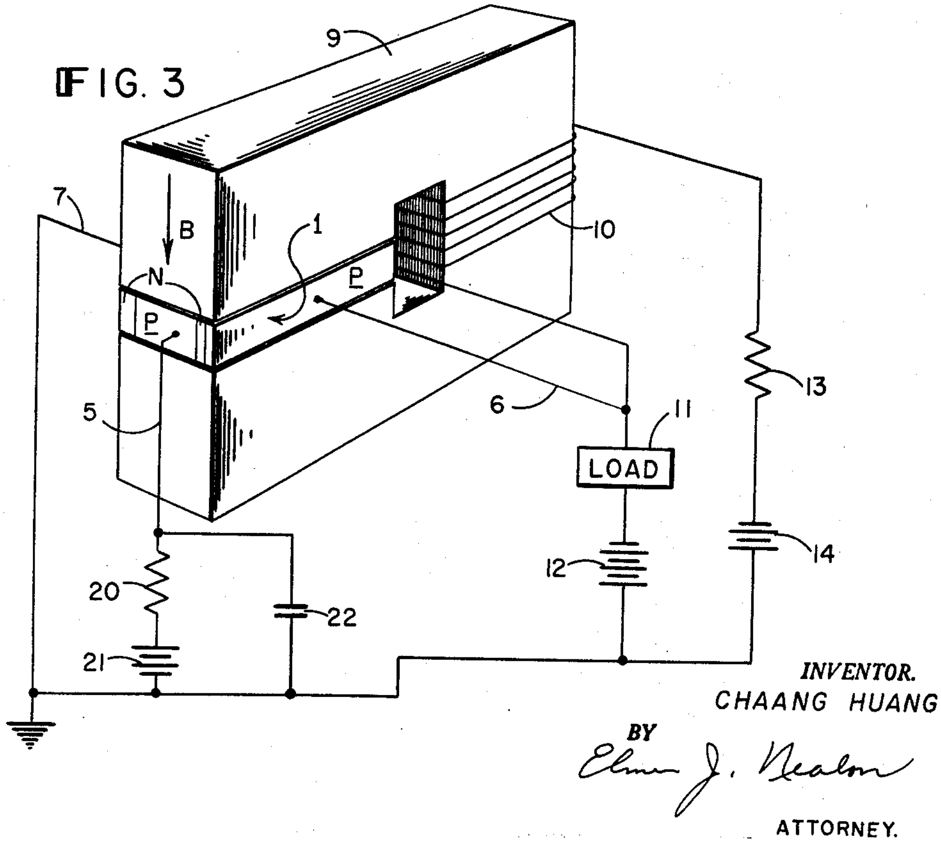
Fig. 3 is a schematic diagram of another embodiment of my invention utilized as an oscillator.

Fig. 3 shows an embodiment of my invention utilized as an oscillator. The semiconductor body and the electro-magnet are identical with those of the apparatus of Figs. 1 and 2. The load impedance 11, field current limiting resistor 13, and the batteries 12 and 14 are also the same. The source biasing potential source and current limiting resistor are replaced by a D.C. source 21 and a resistor 20 having values determined by the requirements of the use of the invention in the oscillator described. The trigger pulse sources and the trigger winding of Figs. 1 and 2 are replaced by a capacitor 22 connected from the source terminal to ground in shunt across resistor 20 and battery 21. The resistance and battery potential are of appropriate value to provide the source with an input characteristic curve having a load line intersecting the curve only in the negative resistance region. This arrangement results in a circuit which is unstable except for the transient action of the condenser 22, which renders the circuit oscillatory.

The circuit of Fig. 3 is rendered "on" or "off" for the period of time required for the condenser to discharge or to charge. When the circuit is in the "off" condition of no current flow through the load, there is a reverse bias on the collector junction and the condenser 22 is in a discharged state. As battery 21 charges the condenser through the resistor 20, the potential of the source terminal rises. When the potential is sufficiently high, holes are injected through the source junction into the semiconductor bulk. Under the action of the magnetic field these holes flow to the drain. A further increase of the source potential as the condenser accumulates charge causes a high hole density near the source junction, and some of the holes flow by diffusion to the space charge region of the collector junction. The resulting effects of collector junction avalanche breakdown, current flow through the load impedance, and reversal of the magnetic field occur as previously explained in the embodiments of Figs. 1 and 2. The circuit is thus placed in the "on" condition.

When the current is "on," a low impedance path is formed through the semiconductor from the source terminal to the collector terminal. Condenser 22 thus starts to discharge. When the condenser discharges to a certain point, the potential on the source terminal is no longer sufficient to inject holes through the source junction into the semiconductor bulk. Since there is no supply of holes at the collector junction to sustain carrier multiplication, this action ceases and current flow through the collector stops. As in the embodiments of Figs. 1 and 2 the magnetic field reverses and a reverse bias is reestablished at the collector junction. The circuit is, therefore, placed in the "off" condition with the condenser in a discharged state.

The action described is repeated as the condenser starts to charge once again. A cyclical action is thus achieved alternately turning the circuit "on" and "off" as the condenser charges and discharges. The output through the load impedance thus is a series of pulses. The pulse frequency is determined by the time constant of the condenser 22 and the resistor 20, and may be varied by varying the value of the capacitance. The circuit described is, therefore, an oscillator with the condenser acting as a medium of storage for the energy necessary to initiate each switching action.

In the foregoing discussion circuits employing specific embodiments of my invention have been disclosed and their modes of operation explained. The translating devices of my invention are capable of switching large amounts of power when activated by triggering signals of relatively small amounts of power, and they require little sustaining power in the "off" or standby condition. Because of their relatively large size and lack of precise base width requirements, these devices are adapted to fabrication by well known crystal growing and diffusion doping techniques without the need for elaborate controls.

Various modifications of the devices shown are immediately apparent from the foregoing detailed description. It is contemplated that similar devices may be fabricated from semiconductive germanium. The conductivity type of each portion of the semiconductor body may of course be reversed, requiring only appropriate reversals in battery and pulse polarities. By altering the resistivity of the semiconductor material and thus the collector breakdown voltage, the maximum power controlled by the device may be varied. Other changes in junction size and circuit component values are also required to obtain a properly proportioned circuit for optimum operation of the device under any given set of conditions. Different arrangements of the source, drain, collector, and magnetic field are also possible; the only requirement being that bulk minority carriers flowing from the source may be deflected either to the drain or to the collector by the action of a magnetic field. Thus the circuits disclosed for utilizing the device of my invention are illustrative only and may be modified depending on the specific use contemplated without departing from the spirit and scope of my invention.

What is claimed is:

1. In combination a body of semiconductor material having a carrier injecting connection, a carrier extracting connection, and a collector, potential means for applying a reverse bias to the collector, magnetic field means for directing carrier flow from said injecting connection to said extracting connection or to said collector, means causing carriers to flow to said reverse biased collector thereby initiating avalanche multiplication of carrier flow through the collector, means including said magnetic field means associated with the collector whereby the flow of carriers through the collector varies the magnetic field further to influence flow of carriers to said collector.

2. The combination as in claim 1 wherein the means causing carriers to flow to said reverse biased collector comprises a signal source connected to said injecting connection.

3. The combination as in claim 1 wherein the means causing carriers to flow to said reverse biased collector comprises means for varying the magnetic field.

4. In combination a body of semiconductor material having its bulk of one conductivity type, a first portion of said body being of the opposite conductivity type and forming a source junction with said bulk, a second portion of said body also being of the opposite conductivity type and forming a collector junction with said bulk, an ohmic drain connection to said bulk, potential means for introducing bulk minority carriers from said source junction into said bulk, potential means for applying a reverse bias to said collector junction, means for establishing a magnetic field through said body to direct bulk minority carriers introduced from said source junction to said drain or to said collector junction, means for introducing bulk minority carriers into the region of the reverse biased collector junction thereby to initiate flow through said collector junction of minority carriers in excess of the quantity introduced, and means for coupling said collector junction to said magnetic field establishing means thereby to permit variation of the magnetic field as a function of the flow of carriers through the collector junction.

5. The combination as in claim 4 wherein the means for introducing bulk minority carriers into the region of the reverse biased collector junction comprises a source of signals applied to said first portion of opposite conductivity.

6. The combination as in claim 4 wherein the means for introducing bulk minority carriers into the region of the reverse biased collector junction comprises pulse means for varying the magnetic field.

7. The combination as in claim 4 wherein the means for introducing bulk minority carriers into the region of the reversed biased collector junction includes an electrical energy storage device.

8. In combination a body of semiconductor material having its bulk of one conductivity type, first and second portions of said body being of the opposite conductivity type and being separated by a part of said bulk, electrodes making low resistance contact with said bulk and with each of said portions of said body, means including said first portion for introducing bulk minority carriers into said bulk, means applied to the electrode contacting said second portion for reverse biasing the junction of said second portion and said bulk, means applied to the electrode contacting said bulk for extracting bulk minority carriers therefrom, magnetic field means for directing bulk minority carriers introduced from said first portion to the region of the electrode connected to said bulk or to the region of the reverse biased junction, control means for varying the magnetic field, means for introducing bulk minority carriers into the region of the reverse biased junction thereby to cause flow through said junction of minority carriers in excess of the quantity introduced from said first portion, said means for applying reverse bias to said junction and said magnetic field control means being associated whereby the flow of minority carriers through said junction tends to vary the magnetic field in such a way that minority carriers introduced at the first portion are directed to said junction region.

9. The combination as in claim 8 wherein the means for introducing bulk minority carriers into the region of the reverse biased junction comprises a source of signals connected to the electrode making low resistance contact with said first portion.

10. The combination as in claim 8 wherein the means for introducing bulk minority carriers into the region of the reverse biased junction comprises additional means for varying the magnetic field.

11. The combination as in claim 8 wherein the means for introducing bulk minority carriers into the region of the reverse biased junction includes energy storage means connected to the electrode making low resistance contact with said first portion, said energy storage means controlling the introduction of bulk minority carriers into the bulk whereby some of the carriers become introduced into the region of the reverse biased junction.

12. In combination a body of semiconductor material having its bulk of one conductivity type, a first portion of said body being of the opposite conductivity type and forming a source junction with said bulk, a second portion of said body also being of the opposite conductivity type and forming a collector junction with said bulk, an ohmic drain connection to said bulk, an electromagnet establishing a magnetic field generally transverse of the paths of flow of bulk minority carriers from the source junction to the collector junction and from the source junction to the drain connection, a field winding on said electromagnet for varying the magnetic field, a source-drain circuit including a D.C. potential source for injecting bulk minority carriers through the source junction into the bulk and a source of trigger pulses, a collector-drain circuit including a load impedance and a D.C. potential source reverse biasing the collector junction, one terminal of the field winding being connected to a point between the collector junction and the load impedance, another terminal of the field winding being connected to a D.C. potential source, the establishment of a reverse bias on said collector junction permitting current to flow through the field winding in the direction which establishes a magnetic field influencing bulk minority carriers injected through the source junction to flow to the drain connection, pulses from said source of trigger pulses introducing additional bulk minority carriers through the source junction which flow to the region of said reverse biased collector junction initiating avalanche breakdown of the junction and resultant current flow through said collector junction and said load impedance, current flow through the load impedance changing the potential at the collector junction and altering the current through the field winding whereby the resulting magnetic field influences the flow of bulk minority carriers to the collector junction.

13. In combination a body of semiconductor material having its bulk of one conductivity type, a first portion of said body being of the opposite conductivity type and forming a source junction with said bulk, a second portion of said body also being of the opposite conductivity type and forming a collector junction with said bulk, an ohmic drain connection to said bulk, an electromagnet establishing a magnetic field generally transverse of the paths of flow of bulk minority carriers from the source junction to the collector junction and from the source junction to the drain connection, a field winding on said electromagnet for varying the magnetic field, a source-drain circuit including a D.C. potential source for injecting bulk minority carriers through the source junction into the bulk, a collector-drain circuit including a load impedance and a D.C. potential source reverse biasing the collector junction, one terminal of the field winding being connected to a point between the collector junction and the load impedance, another terminal of the field winding being connected to a D.C. potential source, a trigger circuit including a trigger winding on said electromagnet and a source of trigger pulses, the establishment of a reverse bias on said collector junction permitting current to flow through the field winding in the direction which establishes a magnetic field influencing bulk minority carriers injected through the source junction to flow to the drain connection, pulses from said source of trigger pulses flowing through said trigger winding in the direction to oppose the established magnetic field thus influencing the bulk minority carriers to flow to the region of said reverse biased collector junction initiating avalanche breakdown of the junction and resultant current flow through said collector junction and said load impedance, current flow through the load impedance changing the potential at the collector junction and altering the current through the field winding whereby the resulting magnetic field influences the flow of bulk minority carriers to the collector junction.

14. In combination a body of semiconductor material having its bulk of one conductivity type, a first portion of said body being of the opposite conductivity type and forming a source junction with said bulk, a second portion of said body also being of the opposite conductivity type and forming a collector junction with said bulk, an ohmic drain connection to said bulk, an electromagnet establishing a magnetic field generally transverse of the paths of flow of bulk minority carriers from the source junction to the collector junction and from the source junction to the drain connection, a field winding on said electromagnet for varying the magnetic field, a source-drain circuit including a first D.C. potential source for injecting bulk minority carriers through the source junction into the bulk and a condenser connected in parallel with said first D.C. potential source, a collector-drain circuit including a load impedance and a D.C. potential source reverse biasing the collector junction, one terminal of the field winding being connected to a point between the collector junction and the load impedance, another terminal of the field winding being connected to a D.C. potential source, the establishment of a reverse bias on said collector junction permitting current to flow through the field winding in the direction which establishes a magnetic field influencing bulk minority carriers injected through the source junction to flow to the drain connection, the charging of said condenser by said first D.C. potential source causing the introduction of bulk minority carriers at an increasing rate through the source junction which carriers flow to the region of said reverse biased collector junction initiating avalanche breakdown of the junction and resultant current flow through said collector junction and said load impedance, current flow through the load impedance changing the potential at the collector junction and altering the current flow through the field winding whereby the resulting magnetic field influences the flow of bulk minority carriers to the collector junction, current flow through said collector junction and said load impedance also altering the potential on said source junction permitting said condenser to discharge and reducing the rate of introduction of bulk minority carriers through the source junction.

15. An apparatus for controlling the flow of electrical energy through a load impedance which comprises a semiconductor body having a source, a collector, and a drain, a magnet disposed with respect to said body to provide a magnetic field therethrough, a first circuit external of said body interconnecting said source and said collector, said first circuit including the load impedance and biasing means normally opposing current flow within the body between the source and the collector, a second circuit external of said body interconnecting said source and said drain, said second circuit including a potential source for supplying current carriers to said body, means for inducing flow of current carriers in said body to the region of the collector thereby causing a flow of current in said first circuit, and means responsive to the flow of current in said first circuit to vary the magnetic field.

16. An electrical device characterized by first and second mutually exclusive stable electric states, said device comprising a semiconductor body having a bulk of one conductivity type and first and second regions of the opposite conductivity type, drain, source, and collector electrodes connected to said bulk, said first, and said second regions respectively, said device being in the first of said electric states when bulk minority carriers flow between said source and said drain electrodes and being in the second of said electric states when said carriers flow between said source and said collector electrodes, the paths of minority carrier flow between said electrodes falling within a common plane, means for establishing a magnetic field having a vector component generally perpendicular to said plane, the magnetic field vector pointing in one direction when said device is in one of said electric states and in the opposite direction when said device is in the other of said electric states, said means for establishing the magnetic field being coupled to said collector electrode thereby to permit variation of the magnetic field as a function of the flow of carriers through the junction between the bulk and second region, and switching means for triggering said device from one electric state to the other electric state.

References Cited in the file of this patent

UNITED STATES PATENTS

| | | |
|---|---|---|
| 2,553,490 | Wallace | May 15, 1951 |
| 2,553,491 | Shockley | May 15, 1951 |
| 2,695,930 | Wallace | Nov. 30, 1954 |
| 2,764,642 | Shockley | Sept. 25, 1956 |
| 2,778,956 | Dacey et al. | Jan. 22, 1957 |